US008700962B2

(12) United States Patent
Tekumalla et al.

(10) Patent No.: US 8,700,962 B2
(45) Date of Patent: Apr. 15, 2014

(54) SCAN TEST CIRCUITRY CONFIGURED TO PREVENT CAPTURE OF POTENTIALLY NON-DETERMINISTIC VALUES

(75) Inventors: Ramesh C. Tekumalla, Breinigsville, PA (US); Prakash Krishnamoorthy, Bethlehem, PA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/560,297

(22) Filed: Jul. 27, 2012

(65) Prior Publication Data

US 2014/0032985 A1    Jan. 30, 2014

(51) Int. Cl.
*G01R 31/28* (2006.01)

(52) U.S. Cl.
USPC .......................................................... 714/726

(58) Field of Classification Search
None
See application file for complete search history.

(56) References Cited

U.S. PATENT DOCUMENTS

| | | | | |
|---|---|---|---|---|
| 6,539,511 B1 * | 3/2003 | Hashizume | | 714/727 |
| 6,570,407 B1 | 5/2003 | Sugisawa et al. | | |
| 7,032,148 B2 * | 4/2006 | Wang et al. | | 714/729 |
| 7,562,275 B2 * | 7/2009 | Juhn et al. | | 714/726 |
| 7,610,527 B2 | 10/2009 | Wang et al. | | |
| 7,818,644 B2 * | 10/2010 | Rajski et al. | | 714/732 |
| 7,831,876 B2 | 11/2010 | Goyal et al. | | |
| 7,895,488 B1 | 2/2011 | Bertanzetti | | |
| 7,913,137 B2 * | 3/2011 | Mukherjee et al. | | 714/729 |
| 7,925,465 B2 * | 4/2011 | Lin et al. | | 702/124 |
| 8,086,923 B2 * | 12/2011 | Cheng et al. | | 714/726 |
| 8,290,738 B2 * | 10/2012 | Lin et al. | | 702/124 |
| 2002/0147951 A1 * | 10/2002 | Nadeau-Dostie et al. | | 714/731 |
| 2002/0162065 A1 * | 10/2002 | Kashiwagi | | 714/726 |
| 2003/0034795 A1 * | 2/2003 | Otto et al. | | 326/16 |
| 2004/0111658 A1 * | 6/2004 | Natsume | | 714/752 |
| 2004/0148554 A1 * | 7/2004 | Dervisoglu et al. | | 714/727 |
| 2005/0060625 A1 * | 3/2005 | Wang et al. | | 714/727 |
| 2007/0011542 A1 * | 1/2007 | Mukherjee et al. | | 714/738 |
| 2007/0022336 A1 | 1/2007 | Branch et al. | | |
| 2007/0234157 A1 * | 10/2007 | Rajski et al. | | 714/728 |
| 2007/0234163 A1 * | 10/2007 | Mukherjee et al. | | 714/736 |
| 2007/0234169 A1 * | 10/2007 | Rajski et al. | | 714/742 |
| 2008/0010573 A1 * | 1/2008 | Sul | | 714/731 |
| 2008/0195346 A1 * | 8/2008 | Lin et al. | | 702/119 |

(Continued)

OTHER PUBLICATIONS

X. Gu et al., "An Effort-Minimized Logic BIST Implementation Method," IEEE International Test Conference (ITC), 2001, pp. 1002-1010.

(Continued)

*Primary Examiner* — Guerrier Merant
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises at least one scan chain having scan cells. The scan test circuitry is configured to control at least a given one of the scan cells so as to prevent the scan cell from capturing a potentially non-deterministic value from a portion of the additional circuitry. The portion of the additional circuitry that provides the potentially non-deterministic value may comprise, for example, at least one of a mixed signal logic block and a memory block of the additional circuitry. The given scan cell may be controlled by configuring the scan cell such that it is unable to capture data in a scan capture mode of operation in which it would otherwise normally be able to capture data.

20 Claims, 5 Drawing Sheets

(56) References Cited

U.S. PATENT DOCUMENTS

| | | | |
|---|---|---|---|
| 2009/0254786 A1* | 10/2009 | Cheng et al. | 714/729 |
| 2011/0166818 A1* | 7/2011 | Lin et al. | 702/117 |
| 2011/0197171 A1* | 8/2011 | Wang et al. | 716/107 |
| 2012/0043991 A1 | 2/2012 | Lin et al. | |
| 2012/0072797 A1* | 3/2012 | Devta-Prasanna | 714/731 |
| 2013/0117618 A1* | 5/2013 | Kukreja et al. | 714/726 |

OTHER PUBLICATIONS

J. Rajski et al., "X-Press Compactor for 1000x Reduction of Test Data," IEEE International Test Conference (ITC), Oct. 2006, pp. 1-10, Paper 18.1.

Y. Tang et al., "X-Masking During Logic BIST and Its Impact on Defect Coverage," IEEE Transactions on Very Large Scale Integration (VLSI) Systems, Feb. 2006, pp. 193-202, vol. 14, No. 2.

M.C.-T. Chao et al., "Response Shaper: A Novel Technique to Enhance Unknown Tolerance for Output Response Compaction," IEEE/ACM International Conference on Computer-Aided Design (ICCAD), Nov. 2005. pp. 80-87.

S. Wang et al., "X-Block: An Efficient LFSR Reseeding-Based Method to Block Unknowns for Temporal Compactors," IEEE Transactions on Computers (ITC), Jul. 2008, pp. 978-989, vol. 57, No. 7.

H. Tang et al., "On Efficient X-Handling Using a Selective Compaction Scheme to Achieve High Test Response Compaction Ratios," International Conference on Very Large Scale Integration (VLSI) Design, Jan. 2005, pp. 59-64.

Y. Tang et al., "X-Masking During Logic BIST and Its Impact on Defect Coverage," IEEE International Test Conference (ITC), Oct. 2004, pp. 442-451, Paper 15.2.

\* cited by examiner

SCAN TEST CIRCUITRY CONFIGURED TO PREVENT CAPTURE OF POTENTIALLY NON-DETERMINISTIC VALUES

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain are configurable to form a serial shift register for applying test patterns at inputs to combinational logic of the integrated circuit. The scan cells of the given scan chain are also used to capture outputs from other combinational logic of the integrated circuit.

Scan testing of an integrated circuit may therefore be viewed as being performed in two repeating phases, namely, a scan shift phase in which the flip-flops of the scan chain are configured as a serial shift register for shifting in and shifting out of respective input and output scan data, and a scan capture phase in which the flip-flops of the scan chain capture scan data from combinational logic. These two repeating scan test phases are often collectively referred to as a scan test mode of operation of the integrated circuit.

Outside of the scan test mode and its scan shift and capture phases, the integrated circuit may be said to be in a functional mode of operation. Other definitions of the scan test and functional operating modes may also be used. For example, the capture phase associated with a given scan test may instead be considered part of a functional mode of operation, such that the modes include a scan shift mode having only the scan shift phase, and a functional mode that includes the capture phase.

In scan testing of an integrated circuit, capture of non-deterministic values from circuitry under test can lead to significant problems. Such non-deterministic values are also commonly referred to as unknowns or X values. By way of example, captured non-deterministic values can interfere with the proper operation of scan circuitry that comprises logic built-in self-test (LBIST) circuitry or scan compression circuitry. Certain types of circuitry under test, such as, for example, mixed signal logic blocks comprising a mix of analog and digital elements, and memory blocks, may be more likely than other types of circuitry to produce non-deterministic values, and a need exists for scan test circuitry that can continue to operate properly despite the presence of such non-deterministic values in the circuitry under test.

SUMMARY

One or more illustrative embodiments of the invention provide scan test circuitry that prevents capture of potentially non-deterministic values from circuitry under test, even if the circuitry under test includes mixed signal logic, memories or other types of circuitry that tend to produce non-deterministic values. As a result, the scan test circuitry in such an embodiment can continue to operate properly in the presence of non-deterministic values in the circuitry under test.

In one embodiment, an integrated circuit comprises scan test circuitry and additional circuitry subject to testing utilizing the scan test circuitry. The scan test circuitry comprises at least one scan chain having a plurality of scan cells. The scan test circuitry is configured to control at least a given one of the scan cells so as to prevent the scan cell from capturing a potentially non-deterministic value from a portion of the additional circuitry. The portion of the additional circuitry that provides the potentially non-deterministic value may comprise, for example, at least one of a mixed signal logic block and a memory block of the additional circuitry. The given scan cell may be controlled by configuring the scan cell such that it is unable to capture data in a scan capture mode of operation in which it would otherwise normally be able to capture data.

By way of example, the given scan cell may be controlled by gating a clock signal applied to a clock input of the given scan cell as a function of a shift enable signal and a scan mode signal. Alternatively, the given scan may be controlled by driving a shift enable input of the given scan cell with a scan mode signal instead of a shift enable signal, the scan cell thereby remaining in a scan shift mode when it would otherwise normally be in a scan capture mode if its shift enable input were driven by the shift enable signal.

In another embodiment, a destination cell comprising a non-scan cell is configured to prevent capture of a potentially non-deterministic value. For example, the destination cell may be configured to include a reset input or a set input, with the reset input or the set input being driven by a signal generated as a function of a shift enable signal and a scan mode signal. In one possible implementation of such an arrangement, the reset or set input of the destination cell is driven by an output of an OR gate that receives as its inputs the shift enable signal and the scan mode signal.

The illustrative embodiments provide significant advantages relative to conventional practice. For example, a given such embodiment avoids the operational problems that can arise when non-deterministic values are captured and further processed by LBIST circuitry or scan compression circuitry. This can allow better fault coverage or reduced test time for a particular scan circuitry implementation.

DETAILED DESCRIPTION

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved scan testing performance by preventing capture of potentially non-deterministic values by one or more scan cells of a scan chain.

Figure 1:
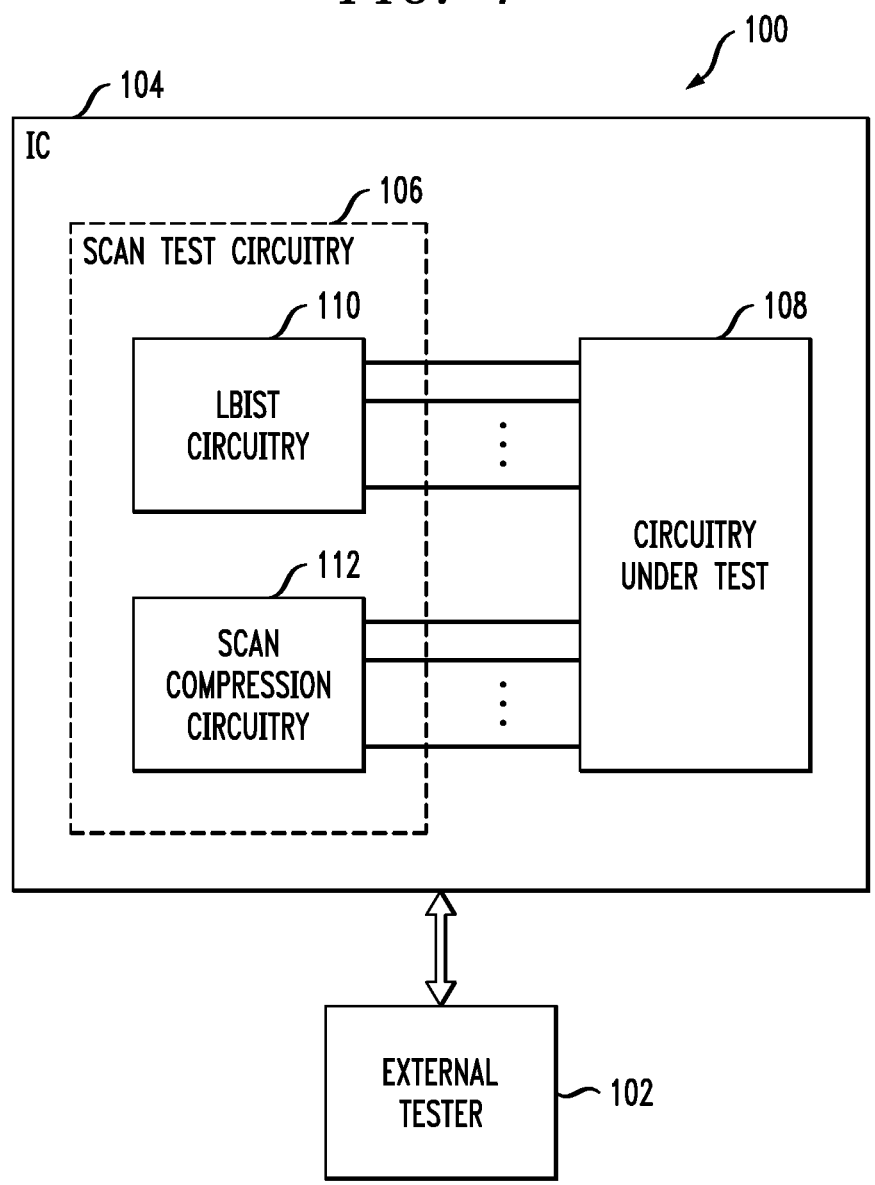
FIG. 1 is a block diagram showing an integrated circuit testing system comprising an integrated circuit that includes scan test circuitry and circuitry under test in an illustrative embodiment.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 in the present embodiment is an external tester relative to the integrated circuit 104, but in other embodiments may be at least partially incorporated into the integrated circuit 104.

The scan test circuitry 106 of the integrated circuit 104 in the present embodiment comprises LBIST circuitry 110 and scan compression circuitry 112, both of which are coupled to the circuitry under test 108. In other embodiments, the scan test circuitry 106 may comprise either LBIST circuitry 110 or scan compression circuitry 112, but not both as in the present embodiment. Embodiments of the present invention may therefore be configured to utilize compressed or noncompressed scan testing, and embodiments of the invention are not limited in this regard.

The LBIST circuitry 110 will be described in greater detail below in conjunction with FIG. 2, and comprises a plurality of scan chains. Each of the individual scan chains is configurable to operate as a serial shift register in a scan shift mode of operation of the integrated circuit 104 and also to capture functional data from combinational logic elements or other functional logic of the circuitry under test 108 in a functional mode of operation of the integrated circuit 104.

The scan compression circuitry 106 is assumed in the present embodiment to include one or more additional sets of scan chains, not necessarily part of the LBIST circuitry 110, that operate in conjunction with compressed scan testing carried out utilizing external tester 102 and scan compression circuitry 112. Thus, in this embodiment, the external tester 102 and scan compression circuitry 112 are utilized for compressed scan testing of one or more portions of the circuitry under test 108, and the LBIST circuitry 110 is utilized for scan testing of one or more portions of the circuitry under test 108, where the same portions of the circuitry under test 108 may be targeted by both the scan compression and LBIST circuitry. It should therefore be understood that the LBIST circuitry 110 and scan compression circuitry 112 may both target the same functional logic in the circuitry under test 108. Also, the LBIST circuitry 110 may be controlled at least in part by the external tester 102. The external tester 102 is therefore not limited to use with the scan compression circuitry 112. Again, other embodiments could perform just LBIST testing or just scan compression testing.

The scan compression circuitry 112 is assumed to more particularly comprise a decompressor, a compressor, and a plurality of scan chains arranged in parallel between outputs of the decompressor and inputs of the compressor. The decompressor is configured to receive compressed scan data from the tester 102 and to decompress that scan data to generate scan test input data that is shifted into the scan chains when such chains are configured as respective serial shift registers in a scan shift mode of operation. The compressor is configured to receive scan test output data shifted out of the scan chains, also when such chains are configured as respective serial shift registers in the scan shift mode of operation, and to compress that scan test output data for delivery back to the tester 102.

The number of scan chains utilized by the scan compression circuitry 112 is generally much larger than the number of decompressor inputs or compressor outputs. The ratio of the number of scan chains to the number of decompressor inputs or compressor outputs provides a measure of the degree of scan test pattern compression provided in the scan compression circuitry 112. It should be noted, however, that the number of compressor outputs need not be the same as the number of decompressor inputs.

Additional details regarding the operation of scan compression elements such as the above-noted decompressor and compressor may be found in U.S. Pat. No. 7,831,876, entitled "Testing a Circuit with Compressed Scan Subsets," which is commonly assigned herewith and incorporated by reference herein.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Figure 2:
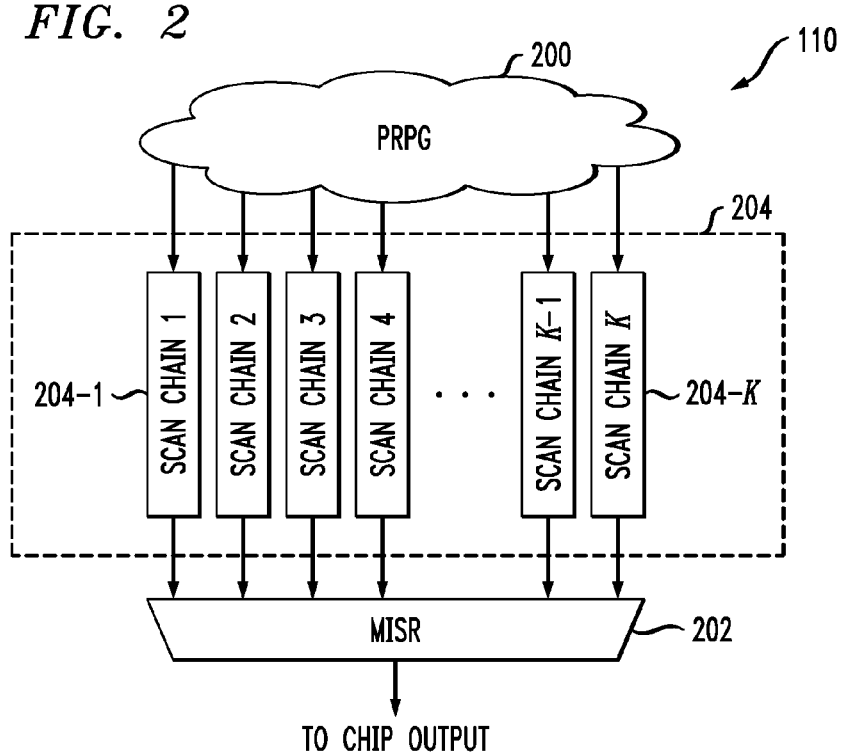
FIG. 2 shows a more detailed view of a portion of the integrated circuit of FIG. 1.

Referring now to FIG. 2, portions of LBIST circuitry 110 are shown in greater detail. In this embodiment, the LBIST circuitry 110 comprises a pseudo random pattern generator (PRPG) 200, a multiple input shift register (MISR) 202, and a plurality of scan chains 204-k, where k=1, 2, . . . K, arranged in parallel between the PRPG 200 and the MISR 202. An output of the MISR 202 is coupled to a designated chip output of the integrated circuit 104.

Like the other scan chains previously described, each of the scan chains 204 comprises a plurality of scan cells, and is configurable to operate as a serial shift register in a scan shift mode of operation of the integrated circuit 104 and to capture functional data from circuitry under test 108 in a functional mode of operation of the integrated circuit 104. The scan chains 204 may be associated with multiple distinct clock domains, or a single clock domain. However, it will be assumed for embodiments to be described herein that the scan chains are associated with a single clock domain.

As will be described in greater detail below, the scan chains 204 are configured to prevent capture of potentially non-deterministic values from portions of the circuitry under test 108. Other scan chains of the scan test circuitry 106, such as those that are part of or otherwise associated with the scan compression circuitry 112, are also assumed to be configured in a similar manner, so as to prevent capture of potentially non-deterministic values from other portions of the circuitry under test 108.

The first scan chain 204-1 is of length $n_1$ and therefore comprises $n_1$ scan cells. More generally, scan chain 204-k is of length $n_k$ and therefore comprises a total of $n_k$ scan cells. In some embodiments of the invention, the lengths of the scan chains 204 are balanced so that the same amount of time is needed to shift the desired set of scan test patterns into all of the scan chains. It may therefore be assumed without limitation that all of the scan chains 204 are of the same length n, such that $n_1 = n_2 = \ldots = n_k = n$.

The circuitry under test 108 in this embodiment may comprise a plurality of logic blocks separated from one another by the scan chains 104. Such logic blocks may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern. Other types of shift modes or phases can be used.

Figure 3:
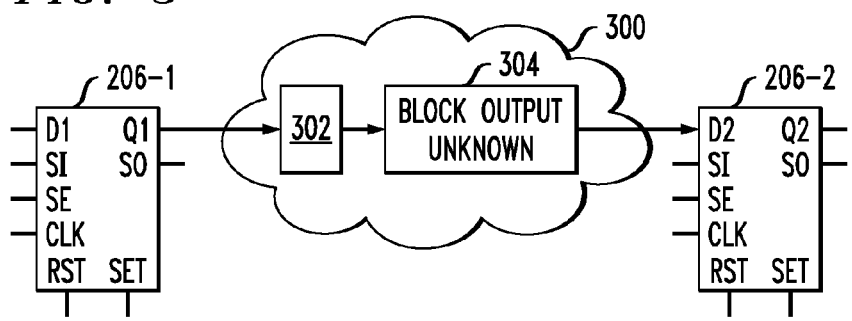
FIG. 3 illustrates the manner in which a non-deterministic value may be captured by a scan cell of a scan chain in the scan test circuitry of the integrated circuit of FIG. 1.

FIG. 3 shows a portion 300 of the circuitry under test 108 that is tested by LBIST circuitry 110. In this embodiment, a source scan cell 206-1 in first scan chain 204-1 provides a data output signal to an input of the circuitry portion 300 and a destination scan cell 206-2 in second scan chain 204-2 receives a data input signal from an output of the circuitry portion 300. The circuitry portion 300 includes a combinational logic block 302 that produces a deterministic output given a deterministic input. However, the circuitry portion further includes at least one mixed signal logic or memory block 304 that has an unknown output even when provided with a deterministic input from combinational logic block 302. The mixed signal logic or memory block 304 may therefore be viewed as providing one or more non-deterministic values to the data input of the destination scan cell 206-2, so as allow the one or more non-deterministic values to be captured by the destination scan cell.

Each of the scan cells 206 in the FIG. 3 embodiment has a functional data input (D), a functional data output (Q), a scan input (SI), a scan output (SO), a shift enable input (SE), a clock input (CLK), a reset input (RST) and a set input (SET), although a given such scan cell may include a variety of other arrangements of inputs and outputs, as will be appreciated by those skilled in the art. For example, the same scan cell output may serve as a scan output in the scan shift mode of operation and as a functional data output in the functional mode of operation, instead of the scan cell providing separate scan and functional data outputs. It is to be appreciated, however, that embodiments of the invention are not limited in terms of the type of scan cells that are used in the scan chains 204. Also, notation such as D, Q, SI, SO, SE, CLK, RST and SET will be used to refer to not only to the scan cell inputs or outputs but also to the corresponding signals.

A shift enable signal applied to the shift enable inputs of a given scan chain or other set of the scan cells 206 at a particular logic level causes the scan cells of that set to form a serial shift register during scan testing. For example, the scan cells of the set can form a serial shift register responsive to the SE signal being at a first designated logic level (e.g., a logic "1" level) and the scan cells of the set can capture functional data when the SE signal is at a second designated logic level (e.g., a logic "0" level). Other logic levels and shift enable signaling arrangements can be used in other embodiments.

In this exemplary LBIST circuitry arrangement, the PRPG 200 generates scan test patterns and serially shifts them into the scan chains 204 during scan shift mode. As indicated above, the SE signal is at the logic "1" level in the scan shift mode, thereby allowing the scan test patterns to be shifted in through the scan cells of the same scan chain. Once an entire scan test pattern has been shifted in, the SE signal returns to the logic "0" level so as to permit scan capture. The clock signal driving the scan cells is typically a relatively slow clock that could come from a chip-level pin of the integrated circuit 104. During scan capture, the values held at the scan outputs of the respective scan cells are also available at the corresponding data outputs of the scan cells.

As noted above, a given value at the data output of source scan cell 206-1 should propagate through circuit portion 300 and be captured at the data input of the destination scan cell 206-2. When the clock edge arrives at the destination scan cell, the data presented at the data input of that scan cell is captured and as a result appears at the data output of the destination scan cell 206-2.

After the scan capture phase, the captured patterns are shifted out of the scan chains to the MISR 202. The MISR accumulates a signature at the end of each pattern and eventually when all the patterns are applied, a final signature is shifted out serially to a chip primary output or another observation point for analysis. Unfortunately, this functionality of the MISR can be corrupted if non-deterministic values are captured by one or more of the scan cells. As indicated previously, similar problems arise if non-deterministic values are captured in the scan chains that feed the compressor of the scan compression circuitry 112.

Figure 4:
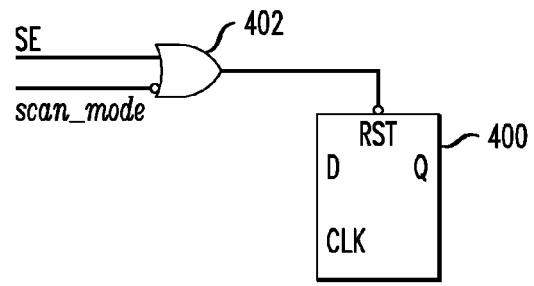
FIG. 4 illustrates a modification that may be made to one or more scan cells of at least one scan chain of the FIG. 1 integrated circuit in order to prevent capture of non-deterministic values.
Figure 6:
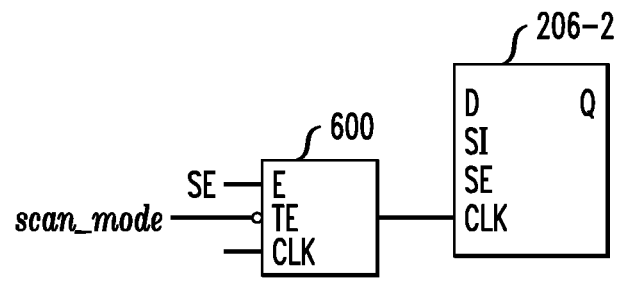
FIGS. 6 and 7 illustrate other exemplary modifications that may be made to one or more scan cells of at least one scan chain of the FIG. 1 integrated circuit in order to prevent capture of non-deterministic values.
Figure 7:
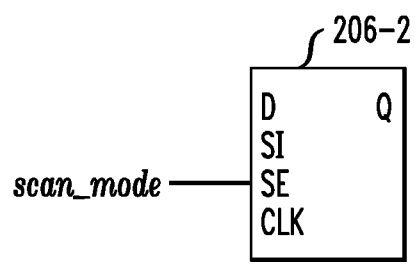

As will be described, FIGS. 4, 6 and 7 illustrate alternative configurations for a given one of the scan cells that prevent capture of non-deterministic values by that scan cell. In the case of the FIG. 4 configuration, the resulting modified cell is not considered part of any scan chain 204 after the modification. However, in the configurations of FIGS. 6 and 7, the modified cells are part of a scan chain 204.

Before the particular modified cell arrangements of FIGS. 4, 6 and 7 are described in detail, reference is made to the timing diagrams of FIG. 5.

Figure 5A:
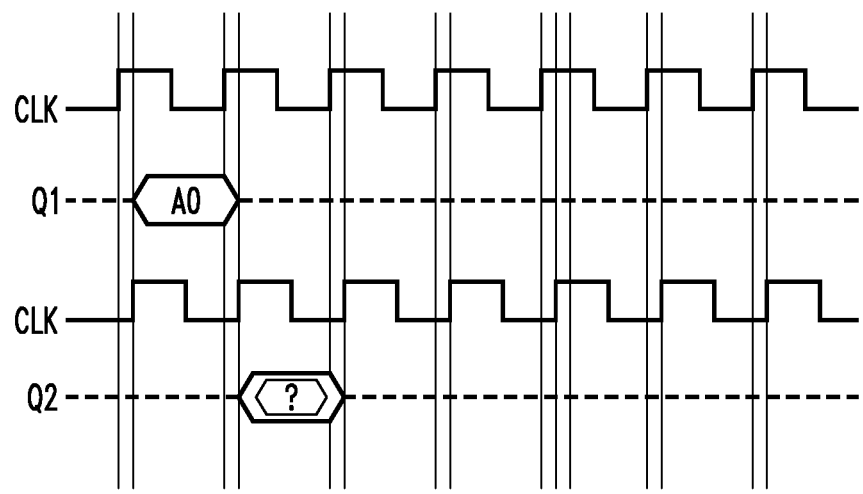
FIGS. 5A and 5B are timing diagrams that illustrate the manner in which capture of a non-deterministic value is prevented in the integrated circuit of FIG. 1.

The capture of non-deterministic values in the FIG. 3 embodiment is more particularly illustrated in the timing diagram of FIG. 5A, which shows the Q1 and Q2 outputs of the respective source and destination scan cells 206-1 and 206-2 as well as the clock signals applied to these respective scan cells. Due to the operation of the mixed signal logic or memory block 304, its output is potentially non-deterministic, and therefore a given Q1 output data value denoted A0 and supplied by source scan cell 206-1 cannot be definitively captured by the destination scan cell 206-2. This assumes that, under proper operation of circuitry portion 300, the data value A0 appearing at the Q1 output of the source scan cell 206-1 should propagate to the Q2 output of the destination scan cell 206-2 as illustrated in the timing diagram of FIG. 5B. The destination scan cell 206-2 in the present embodiment therefore captures non-deterministic values from circuitry portion 300.

As described above, capture of such non-deterministic values by a scan cell can interfere with the proper operation of LBIST circuitry 110, and in particular can interfere with the proper operation of the MISR 202. Again, similar problems can arise when non-deterministic values are captured by a given destination scan cell 206 of a scan chain and provided by that scan chain back to a compressor of the scan compression circuitry 112.

Referring now to FIG. 4, a given scan cell such as destination scan cell 206-2 that receives a non-deterministic value from a mixed signal logic or memory block of the circuitry under test 108 is replaced during integrated circuit design with the modified cell 400. The modified cell 400 is not a scan cell, and therefore is no longer suitable to be incorporated as part of a scan chain. Instead, it is a simplified non-scan cell that includes only data, clock and reset inputs denoted D, CLK and RST respectively, and a data output denoted Q.

The reset input RST is active low, and therefore when the RST signal is at a logic "0" level, the data output Q is reset to a logic "0" level. The RST signal is generated by a logic gate 402, illustratively implemented as an OR gate in this embodiment, which receives as its inputs the previously-described shift enable signal SE and another signal denoted scan_mode. The SE signal is at a logic "1" level during scan shift mode and is at a logic "0" level during capture, and the scan_mode signal is at a logic "1" level in scan mode and is at a logic "0" level in functional mode.

During scan capture mode, SE is at a logic "0" level and scan_mode remains at a logic "1" level such that the RST input generated by logic gate 402 is at a logic "0" level. This will reset the Q output to a logic "0" level, such that any non-deterministic values arriving at the D input will not be captured by the modified cell 400.

Figure 5B:
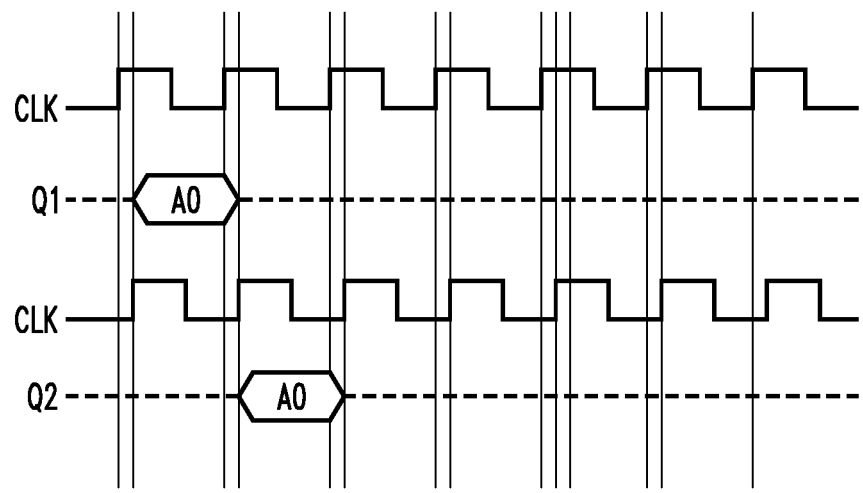

During functional mode, the scan_mode signal is at a logic "0" level such that the RST input is set to a logic "1" level, and the modified cell then operates normally, producing an A0 output at Q2 given the A0 output at Q1, as illustrated in the timing diagram of FIG. 5B.

In one possible variation, the modified cell 400 may be configured such that the logic gate 402 drives a SET input rather than the RST input, in which case the Q output will be set to a logic "1" level during scan capture mode.

Although the FIG. 4 arrangement involves replacing a scan cell with a non-scan cell, other embodiments may simply utilize a modified scan cell. Such a modified scan cell may be functionally the same as the scan cell 206 as previously described, but configured to utilize different input signaling arrangements or supporting logic circuitry. Two exemplary arrangements of this type are shown in FIGS. 6 and 7.

In the FIG. 6 arrangement, the clock input CLK of the destination scan cell 206-2 is driven by the output of a clock gating latch 600. The clock gating latch 600 is configured to shut off the clock signal to the scan cell 206-2 during scan capture mode such that the Q output retains its value and the potentially non-deterministic value at the D input is not captured. The clock gating latch 600 receives as its inputs the scan enable signal SE, the scan_mode signal, and the clock signal CLK. More particularly, as illustrated in the figure, the scan enable signal SE is applied to a functional enable (E) input of the clock gating latch 600, and the scan_mode signal is applied to a test enable (TE) input of the clock gating latch 600.

During scan capture mode, SE is at a logic "0" level and the scan_mode signal remains at a logic "1" level such that the clock gating latch 600 prevents the clock signal CLK from reaching the clock input of the scan cell 206-2. As a result, any non-deterministic values arriving at the D input will not be captured by the scan cell 206-2.

During functional mode, SE is at a logic "0" level and the scan_mode signal is at a logic "0" level such that the clock gating latch 600 is made transparent and the clock signal CLK is applied to the clock input of the scan cell 206-2. This allows functional values arriving at the D input to be captured by the scan cell 206-2.

In the FIG. 7 arrangement, the shift enable input SE of the destination scan cell 206-2 is driven by the scan_mode signal.

During both scan shift and capture modes, the scan_mode signal is at a logic "1" level such that the scan cell 206-2 remains in a scan shift mode regardless of the logic level of the SE signal. As a result, any non-deterministic values arriving at the D input will not be captured by the scan cell 206-2.

During functional mode, the scan_mode signal is at a logic "0" level such that the scan cell 206-2 is able to capture functional values arriving at the D input.

The modified cells of FIG. 4, 6 or 7 in these embodiments are used to replace those scan cells that would otherwise be likely to receive non-deterministic values in a given arrangement of circuitry under test 108. As noted above, the scan cells of FIGS. 6 and 7 are modified in terms of signaling arrangements or supporting circuitry, but are otherwise functionally the same as the scan cell 206-2 as described in conjunction with FIG. 3. The modified cell of FIG. 4 is a non-scan cell, and so exhibits reduced circuit area requirements and power consumption relative to the scan cell 206-2.

It should be understood that the modified scan cells as shown in FIG. 4, 6 or 7 replace only particular scan cells that are identified as being likely to receive non-deterministic values from portions of the circuitry under test 108, such as mixed signal logic blocks or memory blocks.

Thus, in one or more embodiments, an integrated circuit design may be analyzed in a processing system, such as that described in conjunction with FIG. 8 below, in order to identify those scan cells that are likely to receive non-deterministic values from mixed signal logic blocks or memory blocks. Each such scan cell can then be replaced with one of the modified cells described previously.

Analyzing the integrated circuit design will generally involve a number of separate steps, such as, for example, generating a list of all mixed signal logic blocks and memory blocks in the design, determining outputs of each of these blocks, identifying timing paths driven by these outputs, and determining the destination scan cells for the respective timing paths. These destination scan cells are then modified in the manner previously described.

This analysis may be performed prior to scan insertion, such that the identified cells in the case of the FIG. 4 modification are not considered for use in scan chains. As noted previously, the FIG. 6 and FIG. 7 modifications allow the resulting modified cells to be utilized in scan chains.

It should be noted that if the cell modifications involve utilizing logic gate 402 or clock gating latch 600, a single such external element may be used to drive the respective RST or CLK inputs of multiple modified cells. Thus, these elements need not be replicated for each modified cell.

The scan cell modifications illustrated in FIGS. 4, 6 and 7 prevent non-deterministic values from propagating into the MISR 202 of the LBIST circuitry 110 or into a compressor of the scan compression circuitry 112, thereby ensuring proper functionality of these scan test circuitry components. The disclosed techniques can be applied to any integrated circuit design which includes scan cells, and may be implemented without any substantial change in functionality. The use of modified cells as described can provide improved fault coverage or alternatively can reduce test time by reducing pattern count. Also, the disclosed scan cell modifications avoid the need for isolation flip-flops or other inefficient circuitry arrangements that can unduly increase area requirements or power consumption.

It is to be appreciated that the particular circuitry arrangements shown in FIGS. 1-4, 6 and 7 are presented by way of illustrative example only, and numerous alternative arrangements of integrated circuit scan test circuitry may be used to provide an ability to prevent scan cells of a scan chain from capturing potentially non-deterministic values in the manner disclosed herein. As indicated above, this functionality can be implemented in one or more of the illustrative embodiments without any significant negative impact on integrated circuit area requirements or functional timing requirements.

The tester 102 in the testing system 100 of FIG. 1 may be implemented in a wide variety of different configurations. Various conventional testing system arrangements can therefore be modified in a straightforward manner to support the scan test circuitry functionality disclosed herein.

Figure 8:
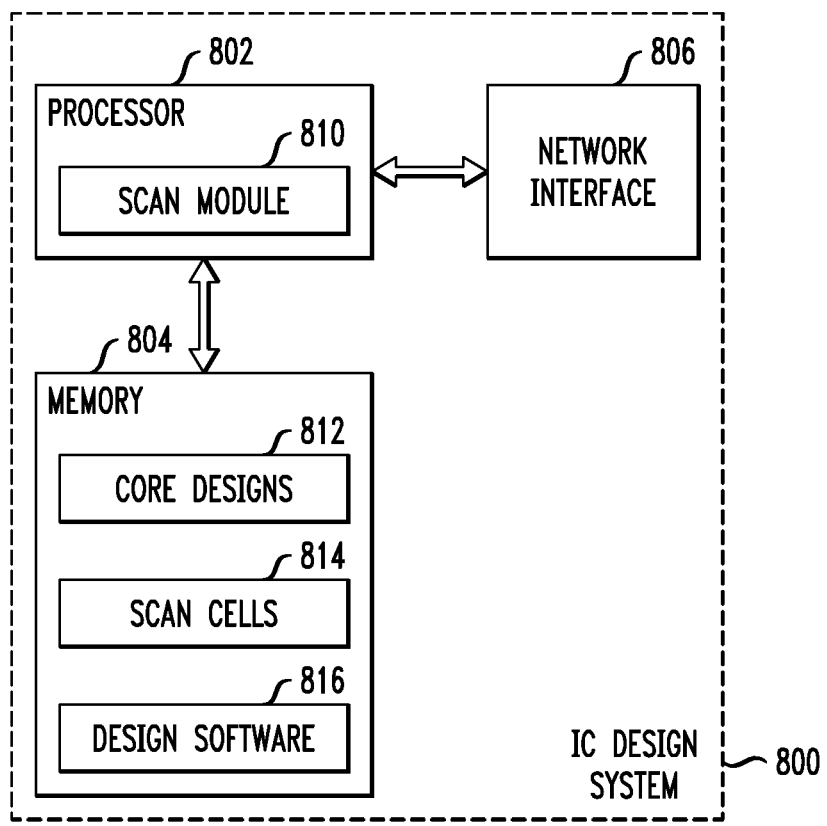
FIG. 8 is a block diagram of a processing system for generating an integrated circuit design in which capture of non-deterministic values is prevented using techniques such as those illustrated in FIGS. 4, 6 and 7.

The insertion of scan cells to form scan chains in scan test circuitry of an integrated circuit design may be performed in a processing system 800 of the type shown in FIG. 8. Such a processing system in this embodiment more particularly comprises an integrated circuit design system configured for use in designing integrated circuits such as integrated circuit 104 to include scan test circuitry 106 comprising at least one of LBIST circuitry 110 and scan compression circuitry 112.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers.

The processor 802 implements a scan module 810 for supplementing core designs 812 with scan cells 814 at least a subset of which are configured so as to be prevented from capturing non-deterministic values in the manner disclosed herein, in conjunction with utilization of integrated circuit design software 816.

Elements such as 810, 812, 814 and 816 are implemented at least in part in the form of software stored in memory 804 and processed by processor 802. For example, the memory 804 may store program code that is executed by the processor 802 to implement particular scan chain configuration functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices.

As indicated above, embodiments of the invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

Again, it should be emphasized that the embodiments of the invention as described herein are intended to be illustrative only. For example, other embodiments of the invention can be implemented using a wide variety of other types of scan test circuitry, with different types and arrangements of scan chains, scan cells and other elements, as well as different types and arrangements of logic gates, shift enable signaling and scan test pattern generation, than those included in the embodiments described herein. These and numerous other alternative embodiments within the scope of the following claims will be readily apparent to those skilled in the art.

What is claimed is:

1. An integrated circuit comprising:
    scan test circuitry; and
    additional circuitry subject to testing utilizing the scan test circuitry;
    the scan test circuitry comprising at least one scan chain having a plurality of scan cells;
    the scan test circuitry being configured to control at least a given one of the scan cells so as to prevent the scan cell from capturing a potentially non-deterministic value from a portion of the additional circuitry, wherein the given scan cell has a clock input and is configured such that its clock input is driven by a clock output of a clock gating latch, and wherein control inputs of the clock gating latch are driven by a shift enable signal and a scan mode signal, and the clock gating latch passes a clock signal from its clock input to its clock output responsive to predetermined logic levels of the shift enable signal and the scan mode signal.

2. The integrated circuit of claim 1 wherein the portion of the additional circuitry that provides the potentially non-deterministic value comprises at least one of a mixed signal logic block and a memory block of the additional circuitry.

3. The integrated circuit of claim 1 wherein the given scan cell is controlled by configuring the scan cell such that it is unable to capture data in a scan capture mode of operation in which it would otherwise normally be able to capture data.

4. The integrated circuit of claim 1 wherein the clock gating latch passes the clock signal from its clock input to its clock output when both the shift enable signal and the scan mode signal are at a first logic level, and further wherein the clock gating latch prevents passage of the clock signal from its clock input to its clock output when the shift enable signal is at the first logic level and the scan mode signal is at a second logic level complementary to the first logic level.

5. A processing device comprising the integrated circuit of claim 1.

6. The processing device of claim 5 wherein the integrated circuit comprises a disk drive controller.

7. A method comprising:
    identifying at least a given one of a plurality of scan cells of a scan chain as being susceptible to capture of a potentially non-deterministic value; and
    controlling the given scan cell so as to prevent the scan cell from capturing the potentially non-deterministic value, wherein the controlling step comprises gating a clock signal applied to a clock input of the given scan cell as a function of a shift enable signal and a scan mode signal.

8. The method of claim 7 wherein the controlling step comprises configuring the given scan cell such that it is unable to capture data in a scan capture mode of operation in which it would otherwise normally be able to capture data.

9. A computer program product comprising a non-transitory computer-readable storage medium having computer program code embodied therein for use in scan testing an integrated circuit, wherein the computer program code when executed causes the steps of the method of claim 7 to be performed.

10. An apparatus comprising:
    a destination cell configured to receive a potentially non-deterministic value;

wherein the destination cell is further configured to prevent capture of the potentially non-deterministic value, wherein the destination cell comprises at least one of a reset input and a set input with said at least one input being driven by a signal generated as a function of a shift enable signal and a scan mode signal.

11. The apparatus of claim 10 wherein the destination cell comprises a scan cell of a scan chain.

12. The apparatus of claim 10 wherein the destination cell comprises a non-scan cell not suitable for use in a scan chain.

13. The apparatus of claim 10 wherein said at least one input is driven by an output of an OR gate that receives as its inputs the shift enable signal and the scan mode signal.

14. A processing system comprising:
a processor; and
a memory coupled to the processor and configured to store information characterizing an integrated circuit design;
wherein the processing system is configured to provide scan test circuitry within the integrated circuit design, the scan test circuitry comprising at least one scan chain having a plurality of scan cells;
the scan test circuitry being configured to control at least a given one of the scan cells so as to prevent the scan cell from capturing a potentially non-deterministic value from a portion of additional circuitry subject to testing utilizing the scan test circuitry, wherein the given scan cell has a clock input and is configured such that its clock input is driven by a clock output of a clock gating latch, and wherein control inputs of the clock gating latch are driven by a shift enable signal and a scan mode signal, and the clock gating latch passes a clock signal from its clock input to its clock output responsive to predetermined logic levels of the shift enable signal and the scan mode signal.

15. The processing system of claim 14 wherein the clock gating latch passes the clock signal from its clock input to its clock output when both the shift enable signal and the scan mode signal are at a first logic level, and further wherein the clock gating latch prevents passage of the clock signal from its clock input to its clock output when the shift enable signal is at the first logic level and the scan mode signal is at a second logic level complementary to the first logic level.

16. An integrated circuit comprising:
scan test circuitry; and
additional circuitry subject to testing utilizing the scan test circuitry;
the scan test circuitry comprising at least one scan chain having a plurality of scan cells;
the scan test circuitry being configured to control at least a given one of the scan cells so as to prevent the scan cell from capturing a potentially non-deterministic value from a portion of the additional circuitry, wherein the given scan cell has a shift enable input and is configured such that its shift enable input is driven by a scan mode signal instead of a shift enable signal, the scan cell thereby remaining in a scan shift mode when it would otherwise normally be in a scan capture mode if its shift enable input were driven by the shift enable signal.

17. The integrated circuit of claim 16 wherein the portion of the additional circuitry that provides the potentially non-deterministic value comprises at least one of a mixed signal logic block and a memory block of the additional circuitry.

18. A processing device comprising the integrated circuit of claim 16.

19. A method comprising:
identifying at least a given one of a plurality of scan cells of a scan chain as being susceptible to capture of a potentially non-deterministic value; and
controlling the given scan cell so as to prevent the scan cell from capturing the potentially non-deterministic value, wherein the controlling step comprises driving a shift enable input of the given scan cell with a scan mode signal instead of a shift enable signal, the scan cell thereby remaining in a scan shift mode when it would otherwise normally be in a scan capture mode if its shift enable input were driven by the shift enable signal.

20. A computer program product comprising a non-transitory computer-readable storage medium having computer program code embodied therein for use in scan testing an integrated circuit, wherein the computer program code when executed causes the steps of the method of claim 19 to be performed.

* * * * *